(12) United States Patent
Seo et al.

(10) Patent No.: US 10,381,519 B2
(45) Date of Patent: Aug. 13, 2019

(54) LIGHT EMITTING DEVICE PACKAGE AND LIGHTING APPARATUS

(71) Applicant: LG INNOTEK CO., LTD., Seoul (KR)

(72) Inventors: Jae Won Seo, Seoul (KR); Hoe Jun Kim, Seoul (KR); Bum Jin Yim, Seoul (KR); Jun Hee Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/550,955

(22) PCT Filed: Mar. 16, 2016

(86) PCT No.: PCT/KR2016/002612
§ 371 (c)(1),
(2) Date: Aug. 14, 2017

(87) PCT Pub. No.: WO2016/153213
PCT Pub. Date: Sep. 29, 2016

(65) Prior Publication Data
US 2018/0026163 A1 Jan. 25, 2018

(30) Foreign Application Priority Data
Mar. 26, 2015 (KR) .................. 10-2015-0042659

(51) Int. Cl.
*H01L 33/44* (2010.01)
*H01L 33/62* (2010.01)
(Continued)

(52) U.S. Cl.
CPC ............ *H01L 33/44* (2013.01); *H01L 33/382* (2013.01); *H01L 33/62* (2013.01); *H01L 33/145* (2013.01); *H01L 33/32* (2013.01); *H01L 33/405* (2013.01)

(58) Field of Classification Search
CPC .......................................... H01L 33/0004–648
See application file for complete search history.

(56) References Cited

U.S. PATENT DOCUMENTS

2006/0261358 A1 11/2006 Hwang et al.
2006/0261361 A1 11/2006 Shakuda
(Continued)

FOREIGN PATENT DOCUMENTS

CN 102163666 A 8/2011
CN 103119735 A 5/2013
(Continued)

*Primary Examiner* — Cuong B Nguyen
(74) *Attorney, Agent, or Firm* — Birch, Stewart, Kolasch & Birch, LLP (57) ABSTRACT

A light emitting device package, according to an embodiment, includes: a substrate; a light emitting structure that is disposed below the substrate and includes a first conductive type semiconductor layer, an active layer, and a second conductive type semiconductor layer; a first bonding pad connected with the first conductive type semiconductor layer while being embedded in a through-hole exposed the first conductive type semiconductor layer by passing through the active layer and the second conductive type semiconductor layer; a second bonding pad that is disposed below the second conductive type semiconductor layer while being spaced apart from the first bonding pad and is connected with the second conductive type semiconductor layer; a first insulation layer disposed on the lateral portion of the light emitting structure in the through-hole and on the lower inner edge of the light emitting structure; and a second insulation layer disposed between the first insulation layer and the first bonding pad in the through-hole.

20 Claims, 6 Drawing Sheets

(51) Int. Cl.
*H01L 33/38* (2010.01)
*H01L 33/32* (2010.01)
*H01L 33/40* (2010.01)
*H01L 33/14* (2010.01)

(56) References Cited

U.S. PATENT DOCUMENTS

| | | |
|---|---|---|
| 2007/0126013 A1 | 6/2007 | Kim et al. |
| 2009/0200568 A1 | 8/2009 | Horie |
| 2011/0068359 A1 | 3/2011 | Yahata et al. |
| 2011/0266558 A1* | 11/2011 | Yano ................ H01L 21/0485 |
| | | 257/77 |
| 2012/0074441 A1 | 3/2012 | Seo et al. |
| 2012/0223345 A1 | 9/2012 | Tomoda et al. |
| 2013/0221398 A1 | 8/2013 | Kim et al. |
| 2014/0209955 A1* | 7/2014 | Kim .................... H01L 33/62 |
| | | 257/99 |
| 2014/0312369 A1 | 10/2014 | Yoon et al. |

FOREIGN PATENT DOCUMENTS

| | | |
|---|---|---|
| JP | 2006-245156 A | 9/2006 |
| JP | 2006-324433 A | 11/2006 |
| JP | 2011-66304 A | 3/2011 |
| JP | 2012-182276 A | 9/2012 |
| KR | 10-0668964 B1 | 1/2007 |
| KR | 10-1362081 B1 | 2/2014 |
| WO | WO 2007/126094 A1 | 11/2007 |

\* cited by examiner

LIGHT EMITTING DEVICE PACKAGE AND LIGHTING APPARATUS

CROSS REFERENCE TO RELATED APPLICATIONS

This application is the National Phase of PCT International Application No. PCT/KR2016/002612, filed on Mar. 16, 2016, which claims priority under 35 U.S.C. 119(a) to Patent Application No. 10-2015-0042659, filed in the Republic of Korea on Mar. 26, 2015, all of which are hereby expressly incorporated by reference into the present application.

TECHNICAL FIELD

Embodiments relate to a light emitting device package and lighting apparatus.

BACKGROUND ART

A light emitting diode (LED) is a kind of semiconductor device that converts electricity into infrared rays or light using the properties of a compound semiconductor to transmit or receive a signal or that is used as a light source.

Group III-V nitride semiconductors have attracted attention as a core material of a light emitting device, such as a light emitting diode (LED) or a laser diode (LD), thanks to the physical and chemical properties thereof.

The light emitting diode exhibits excellent environmentally friendly characteristics, since the light emitting diode does not include environmentally toxic materials, such as mercury (Hg), which is used in conventional lighting fixtures, such as an incandescent lamp and a fluorescent lamp. In addition, the light emitting diode has advantages of a long lifespan and low power consumption. For these reasons, the light emitting diode has replaced conventional light sources.

In a conventional light emitting device package, the carriers supplied into the active layer are not evenly injected, thereby deteriorating current spreading. Thus, it is requested to improve the deterioration.

DISCLOSURE

Technical Problem

Embodiments provide a light emitting device package and a lighting apparatus having an improved current spreading, and being capable of simply and fast being manufactured.

Technical Solution

In one embodiment, a light emitting device package may include a substrate; a light emitting structure disposed under the substrate, the light emitting structure including a first conductive type semiconductor layer, an active layer, and a second conductive type semiconductor layer; a first bonding pad embedded in a through-hole to be connected to the first conductive type semiconductor layer, the through-hole passing through the active layer and the second conductivity type semiconductor layer to expose the first conductive type semiconductor layer; a second bonding pad spaced apart from the first bonding pad and disposed under the second conductive type semiconductor layer, the second bonding pad being connected to the second conductive type semiconductor layer; a first insulation layer disposed on a side portion of the light emitting structure in the through-hole and on an inner lower edge of the light emitting structure; and a second insulation layer disposed between the first insulation layer and the first bonding pad in the through-hole.

For example, the first insulation layer may include a first segment disposed on the side of the light emitting structure in the through-hole; and a second segment extending from the first segment in a first direction crossing a thickness direction of the light emitting structure and disposed on the inner lower edge of the light emitting structure. The first insulation layer may further include at least one third segment disposed with extending from the first segment toward an inside of the second conductive type semiconductor layer in the first direction under the active layer. The first insulation layer may further include a fourth segment disposed on an outer side and on an outer lower edge of the light emitting structure, respectively.

For example, the light emitting device package may further include a first electrode disposed between the first conductive type semiconductor layer exposed in the through-hole and the first bonding pad. The second insulation layer may be disposed with extending to between the first electrode and the first insulation layer.

For example, the light emitting device package may further include a second electrode disposed between the second conductive type semiconductor layer and the second bonding pad.

For example, the second electrode may include a reflective layer disposed under the second conductive type semiconductor layer; and a light-transmitting electrode layer disposed between the reflective layer and the second conductive type semiconductor layer. The second segment of the first insulation layer may be disposed between the light-transmitting electrode layer and the inner lower edge of the second conductive type semiconductor layer, and the fourth segment may be disposed between the light-transmitting electrode layer and the outer lower edge.

For example, the second electrode may include a reflective layer disposed under the second conductive type semiconductor layer. The second segment of the first insulation layer may be disposed between the reflective layer and the inner lower edge of the second conductive type semiconductor layer, and the fourth segment may be disposed between the reflective layer and the outer lower edge.

For example, the second electrode may include a light-transmitting electrode layer disposed under the second conductive type semiconductor layer. The second segment of the first insulation layer may be disposed between the light-transmitting electrode layer and the inner lower edge of the second conductive type semiconductor layer, and the fourth segment may be disposed between the light-transmitting electrode layer and the outer lower edge.

For example, the inside of the second conductive type semiconductor layer in which the third segment is disposed may include at least one of an upper portion, a lower portion, or a middle portion of the second conductive type semiconductor layer. The at least one third segment may include a plurality of third segments extending from the first segment in the first direction with being spaced apart side by side from each other. A length of the second or fourth segment in the first direction may be 20 μm to 30 μm. A ratio of widths of the first bonding pad and the second bonding pad in the first direction may be 9:1 or 8:2. At least one of the first or second insulation layer may include a photosensitive polyimide.

For example, the light emitting device package may further include first and second lead frames connected to the first and second bonding pads, respectively.

In another embodiment, a lighting apparatus may include the light emitting device package.

Advantageous Effects

A light emitting device package and a lighting apparatus according to the embodiments have high current density and an improved current spreading by well injecting the carriers into the portion in which the current spreading is vulnerable, where the defective rate incurred in using $SiO_2$ as a first insulation layer may be solved by forming a first insulation layer using photosensitive polyimide, where the manufacturing process may be simplified, thereby shortening the processing time, where the role of the current blocking layer may be more faithfully performed, and wherein, in case that a second electrode includes a reflection layer consisting of silver (Ag), the first insulation layer is provided, thereby protecting the light emitting structure from Ag migration and impurities.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

In the drawings, the size of each layer (or each portion) may be omitted or schematically illustrated for clarity and convenience. In addition, the size of each element does not wholly reflect an actual size thereof. In addition, the same reference numerals indicate the same elements throughout the description of the drawings.

Hereinafter, light emitting device packages 100 and 200 according to embodiments will be described with referring to the attached drawings as follows. For convenience, although the light emitting device packages 100 and 200 are described using the Cartesian coordinate system (x-axis, y-axis, z-axis), they may of course be described using other coordinate systems. With the Cartesian coordinate system, although the x-axis, the y-axis and the z-axis are orthogonal to one another, the embodiments are not limited thereto. That is, according to other embodiment, the x-axis, the y-axis and the z-axis may cross one another.

Figure 1:
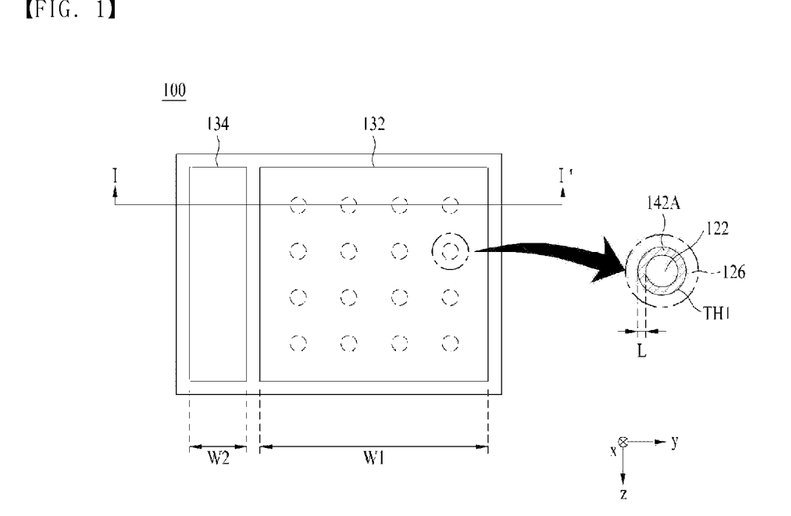
FIG. 1 is a plan view of a light emitting device package according to an embodiment.
Figure 2:
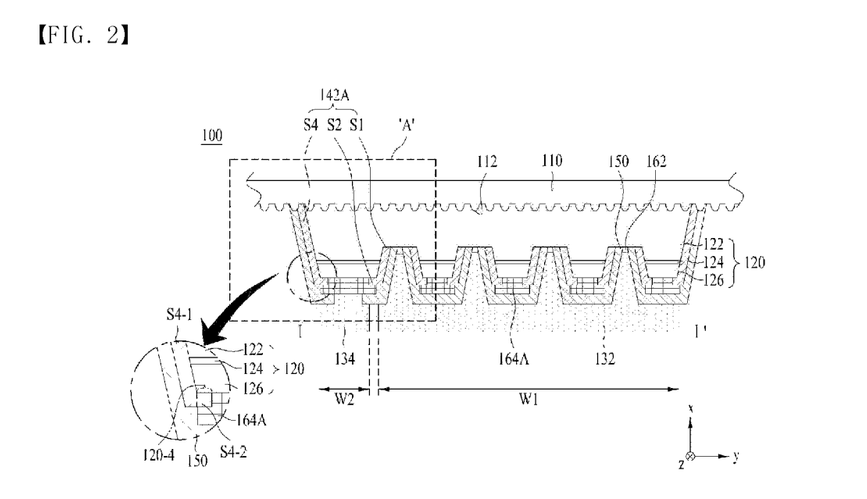
FIG. 2 is a cross-sectional view taken along line I-I' of the light emitting device package illustrated in FIG. 1.

FIG. 1 is a plan view of a light emitting device package 100 according to an embodiment, and FIG. 2 is a cross-sectional view taken along line I-I' of the light emitting device package 100 illustrated in FIG. 1.

In order to assist in understanding, in FIG. 1, the first through-hole TH1 covered by the first bonding pad 132 is indicated by a dotted line and the first through-hole TH1 in the enlarged view is indicated by a solid line. In addition, in FIG. 1, the number of the first through-holes TH1 is exemplified as 16, but the embodiment is not limited to this. That is, the number of the first through-holes TH1 may be more or less than 16.

In addition, although the first through-hole TH1 is shown as having a circular planar shape in FIG. 1, the embodiment is not limited thereto. That is, according to another embodiment, the first through-hole TH1 may have various plan shapes.

Referring to FIGS. 1 and 2, the light emitting device package 100 according to one embodiment may include a substrate 110, a light emitting structure 120, a first bonding pad 132, a second bonding pad 134, a first insulation layer 142A, a second insulation layer 150, a first electrode 162, and a second electrode 164A.

The light emitting structure 120 may be disposed under the substrate 110.

The substrate 110 may include a conductive material or a non-conductive material. For example, although the substrate 110 may include at least one of sapphire ($Al_2O_3$), GaN, SiC, ZnO, GaP, InP, $Ga_2O_3$, GaAs, or Si. In addition, in order to help a light emitted from the active layer 124 escape from the light emitting device package 100, for example, the substrate 110 may be a patterned sapphire substrate (PSS) having a pattern 112, but the embodiment is not limited thereto.

In order to solve a problem related to the difference in the coefficient of thermal expansion and lattice-mismatching between the substrate 110 and the light emitting structure 120, a buffer layer (or a transition layer) (not illustrated) may be provided between the two 110 and 120. The buffer layer may include at least one material selected from the group consisting of Al, In, N, and Ga, for example, without being limited thereto. In addition, the buffer layer may have a single-layer or multilayer structure.

The light emitting structure 120 may be disposed under the substrate 110, and include a first conductive type semiconductor layer 122, an active layer 124, and a second conductive type semiconductor layer 126 which are stacked one above another in sequence under the substrate 110.

The first conductive type semiconductor layer 122 may be disposed under the substrate 110 and be formed of a semiconductor compound such as, for example, a group III-V or II-VI semiconductor compound which is doped with a first conductive type dopant. When the first conductive type semiconductor layer 122 is an n-type semiconductor layer, the first conductive type dopant may include Si, Ge, Sn, Se, Te as an n-type dopant, without being limited thereto.

For example, the first conductive type semiconductor layer 122 may include a semiconductor material having a composition of $Al_xIn_yGa_{(1-x-y)}N$ ($0 \leq x \leq 1$, $0 \leq y \leq 1$, $0 \leq x+y \leq 1$). The first conductive type semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

The active layer 124 may be disposed between the first conductive type semiconductor layer 122 and the second conductive type semiconductor layer 126. The active layer 124 is a layer in which electrons (or holes) introduced through the first conductive type semiconductor layer 122 and holes (or electrons) introduced through the second conductive type semiconductor layer 126 meet each other to emit light having energy that is determined by the inherent energy band of a constituent material of the active layer 124. The active layer 124 may have at least one structure of a single-well structure, a multi-well structure, a single-quantum well structure, a multi-quantum well (MQW) structure, a quantum dot structure, or a quantum wire structure.

The active layer 124 may include a well layer and a barrier layer having a pair structure of any one or more selected from among InGaN/GaN, InGaN/InGaN, GaN/AlGaN, InAlGaN/GaN, GaAs(InGaAs)/AlGaAs, and GaP (InGaP)/AlGaP, without being limited thereto. The well layer may be formed of a material having lower band gap energy than the band gap energy of the barrier layer.

A conductive clad layer (not illustrated) may further be formed on and/or under the active layer 124. The conductive clad layer may be formed of a semiconductor having higher band gap energy than the band gap energy of the barrier layer of the active layer 124. For example, the conductive clad layer may include, for example, a GaN, AlGaN, InAlGaN, or super-lattice structure. In addition, the conductive clad layer may be doped to an n-type or a p-type.

The second conductive type semiconductor layer 126 may be disposed under the active layer 124 and be formed of a semiconductor compound such as, for example, a group III-V or II-VI semiconductor compound. For example, the second conductive type semiconductor layer 126 may include a semiconductor material having a composition of $In_xAl_yGa_{(1-x-y)}N$ ($0 \leq x \leq 1$, $0 \leq y \leq 1$, $0 \leq x+y \leq 1$). The second conductive type semiconductor layer 126 may be doped with a second conductive type dopant. When the second conductive type semiconductor layer 126 is a p-type semiconductor layer, the second conductive type dopant may include, for example, Mg, Zn, Ca, Sr, or Ba as a p-type dopant.

The first conductive type semiconductor layer 122 may be configured as an n-type semiconductor layer, and the second conductive type semiconductor layer 126 may be configured as a p-type semiconductor layer. Alternatively, the first conductive type semiconductor layer 122 may be configured as a p-type semiconductor layer, and the second conductive type semiconductor layer 126 may be configured as an n-type semiconductor layer.

The light emitting structure 120 may have any one structure among an n-p junction structure, a p-n junction structure, an n-p-n junction structure, and a p-n-p junction structure.

Hereinafter, for convenience of description, the y-axis direction is referred to as a first direction, the x-axis direction as a thickness direction of the light emitting structure 120 is referred to as a second direction, and the z-axis direction is referred to as a third direction. Hereinafter, although, the first, second, and third directions are orthogonal to one another in the following description, the following description may be applied to the case that the first, second, and third directions may cross one another.

The first bonding pad 132 is embedded in the first through-hole TH1 which exposes the first conductive type semiconductor layer 122 by passing through the second conductive type semiconductor layer 126 and the active layer 124 so that the first bonding pad 132 may be electrically connected to the first conductive type semiconductor layer 122 through the first electrode 162. The first bonding pad 132 may have a first width W1 in at least one direction of the first direction or the third direction orthogonal to the second direction. In FIG. 2, the first width W1 in the first direction is shown.

The second bonding pad 134 may be spaced apart from the first bonding pad 132 in the first direction and be disposed under the second conductive type semiconductor layer 126. The second bonding pad 134 may be electrically connected to the second conductive type semiconductor layer 126 through the second electrode 164A. The second bonding pad 134 may have a second width W2 in at least one direction of the first direction or the third direction orthogonal to the second direction. In FIG. 2, the second width W2 in the first direction is shown.

Each of the first and second bonding pads 132 and 134 may include a metal having electrical conductivity, and may include a material that is the same as or different from the material of each of the first and second electrodes 162 and 164A. Each of the first and second bonding pads 132 and 134 may be formed of at least one of Ti, Ni, Au, or Sn, but the embodiment is not limited thereto. For example, each of the first and second bonding pads 132 and 134 may include Ti/Ni/Au/Sn/Au.

In addition, according to the embodiment, the ratio of the first width W1 of the first bonding pad 132 to the second width W2 of the second bonding pad 134 may be expressed by the following Equation 1 or Equation 2, but the embodiment is not limited thereto.

$$W1:W2=9:1 \qquad \text{[Equation 1]}$$

$$W1:W2=8:2 \qquad \text{[Equation 2]}$$

Figure 3:
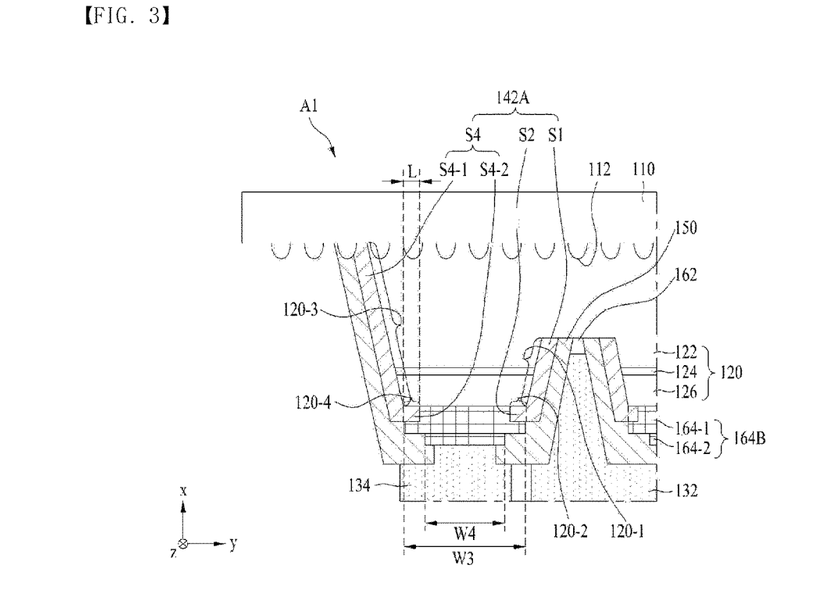
FIG. 3 shows an enlarged cross-sectional view of an embodiment of the 'A' part shown in FIG. 2.

FIG. 3 shows an enlarged cross-sectional view of an embodiment A1 of the 'A' part shown in FIG. 2. The second electrode 164B shown in FIG. 3 has a structure different from the structure of the second electrode 164A shown in FIG. 2. Except for this, the light emitting device package shown in FIG. 3 is the same as the light emitting device package shown in FIG. 2. Therefore, the light emitting device package 100 shown in FIG. 2 is described with referring to an enlarged sectional view A1 shown in FIG. 3.

Referring to FIG. 3, the first insulation layer 142A may be disposed on the side (portion) 120-1 of the light emitting structure 120 in the first through-hole TH1 and the inner lower edge 120-2 of the light emitting structure 120. That is, the first insulation layer 142A may include first and second segments S1 and S2.

The first segment S1 may be disposed on the side portion 120-1 of the light emitting structure 120 in the first through-hole TH1. The second segment S2 may extend from the first segment S1 in at least one direction of the first direction or the third direction perpendicular to the second direction which is the thickness direction of the light emitting structure 120 so that the second segment S2 may be disposed on the inner lower edge 120-2 of the light emitting structure 120. As shown in FIG. 3, the second segment S2 extends from the first segment S1 in the first direction. Of course, although not shown, the second segment S2 may also extend from the first segment S1 in the third direction.

Figure 4:
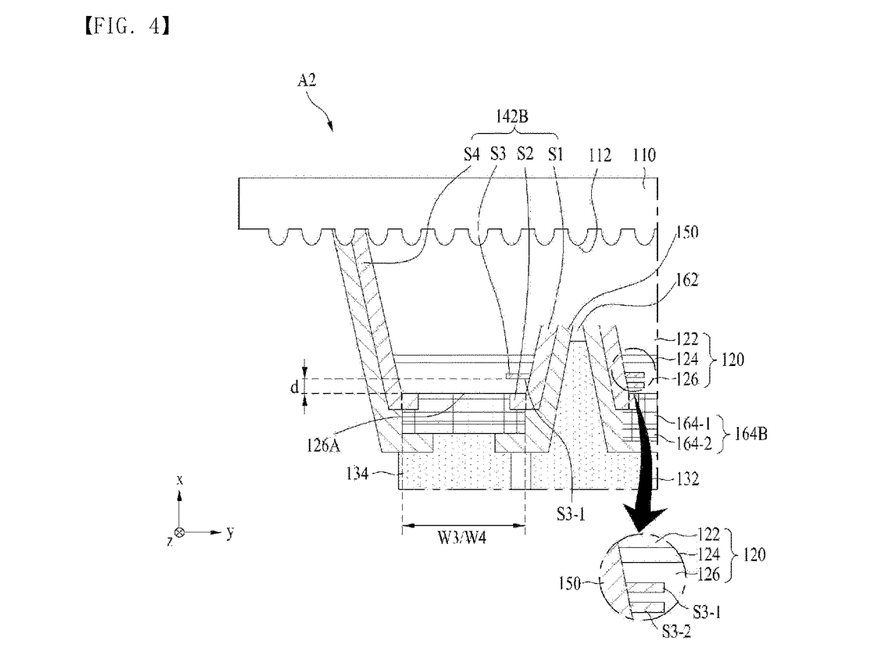
FIG. 4 shows an enlarged cross-sectional view of another embodiment with respect to the 'A' part shown in FIG. 2.

FIG. 4 shows an enlarged cross-sectional view of another embodiment A2 with respect to the 'A' part shown in FIG. 2. The second electrode 164B shown in FIG. 4 has a structure different from a structure of the second electrode 164A shown in FIG. 2, and the first insulation layer 142B shown in FIG. 4 has a structure different from a structure of the first insulation layer 142A shown in FIG. 2. Except for these, the light emitting device package shown in FIG. 4 is the same as the light emitting device package shown in FIG. 2. Therefore, the parts of the light emitting device package shown in FIG. 4 which are the same as those of the light emitting device package 100 shown in FIG. 2 will not be described again.

Referring to FIG. 4, the first insulation layer 142A may further include a third segment S3 as well as the first and second segments S1 and S2. The third segment S3 may be disposed with extending from the first segment S1 under the active layer 124 in at least one direction of the first direction or the third direction. In case of FIG. 4, the third segment S3 extends from the first segments S1 in the first direction. Needless to say, although not shown, the third segment S3 may extend in the third direction from the first segment S1.

In addition, the third segment S3 of the first insulation layer 142B may be disposed in the middle portion (or, the middle part) of the second conductive type semiconductor layer 126 in the second direction, but the embodiments are not limited thereto.

According to another embodiment, the third segment S3 of the first insulation layer 142B may be disposed under the second conductive type semiconductor layer 126. In this case, the distance d between a bottom surface S3-1 of the third segment S3 of the first insulation layer 142B shown in FIG. 4 and a bottom surface 126A of the second conductive type semiconductor layer 126 may be '0.'

According to still another embodiment, the third segment S3 of the first insulation layer 142B may also be disposed on an upper portion of the second conductive type semiconductor layer 126. That is, the third segment S3 may be disposed between the second conductive type semiconductor layer 126 and the active layer 124. In this case, the third segment S3 may be disposed in contact with the active layer 124

In addition, the third segment S3 of the first insulation layer 142B may include a plurality of third segments disposed on at least two of an upper, a middle, or a lower portion of the second conductive type semiconductor layer 126. For example, as illustrated in FIG. 4, the third segment S3 may include a plurality of third-first and third-second segments S3-1 and S3-2. The third-first segment S3-1 may be disposed between the active layer 124 and the third-second segment S3-2 at the upper portion of the second conductive type semiconductor layer 126. The third-second segment S3-2 may be disposed between the third-first segment S3-1 and the second segment S2 at the middle portion of the second conductive type semiconductor layer 126.

In addition, the first insulation layer 142A may further include a fourth segment S4. Referring to FIG. 3, the fourth segment S4 may include a fourth-first 4-1 segment S4-1 disposed on the outer portion 120-3 of the light emitting structure 120 and a fourth-second segment S4-2 disposed on an outer lower edge 120-4 of the light emitting structure 120.

Figure 6A:
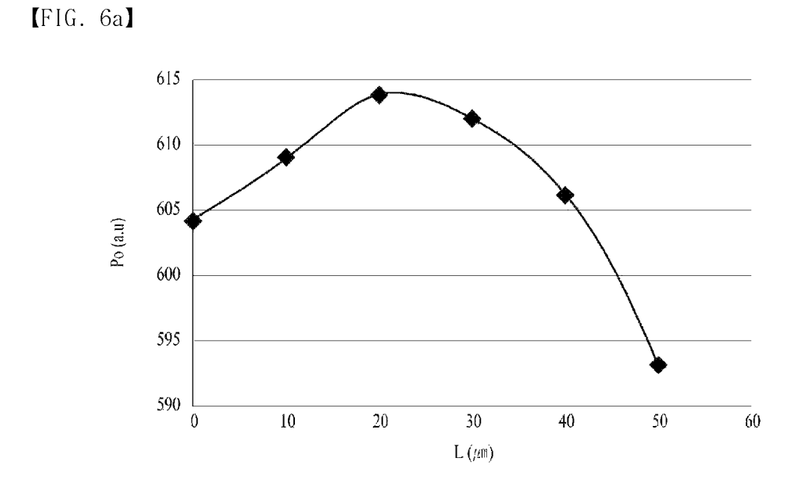
FIG. 6a shows the light output power Po of the light emitting device package according to the embodiment.
Figure 6B:
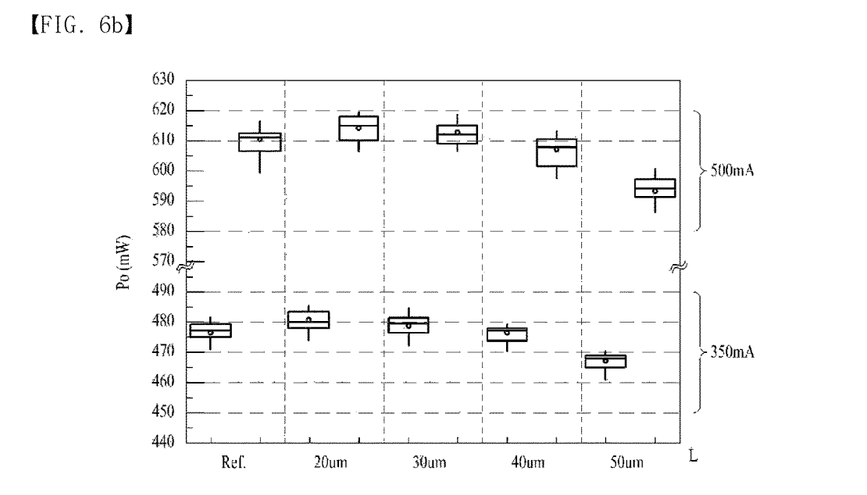
FIG. 6b is a graph showing a comparison of the light output powers Po in the comparative example and in the embodiment

Each of The aforementioned first insulation layers 142A and 142B may function as a kind of current blocking layer (CBL). This will be described later in detail with reference to FIG. 6 attached hereto.

Meanwhile, the second insulation layer 150 may be disposed between the first insulation layer 142A or 142B and the first bonding pad 132 in the first through-hole TH1. In addition, the second insulation layer 150 may be disposed between the second electrode 164A or 164B and the first bonding pad 132 to electrically insulate the second electrode 164A or 164B from the first bonding pad 132.

At least one of the first insulation layer 142A or 142B or the second insulation layer 150 may be formed of photosensitive polyimide (PSPI), but the embodiment is not limited thereto. Alternatively, at least one of the first insulation layer 142A or 142B or the second insulation layer 150 may include at least one of $SiO_2$, $TiO_2$, $ZrO_2$, $Si_3N_4$, $Al_2O_3$, or $MgF_2$. The first insulation layers 142A and 142B and the second insulation layer 150 may include a material that is the same as or different from each other.

The first electrode 162 may be disposed between the first conductive type semiconductor layer 122 exposed in the first through-hole TH1 and the first bonding pad 132. In this case, the second insulation layer 150 may be disposed between the first electrode 162 and the first insulation layers 142A and 142B, but embodiments are not limited thereto.

The first electrode 162 may include a material capable of being in ohmic contact with the first conductive type semiconductor layer 122 to function as an ohmic layer so that a separate ohmic layer (not shown) may not be required. Alternatively, a separate ohmic layer may be disposed between the first electrode 162 and the first conductive type semiconductor layer 122.

The second electrode 164A or 164B may be disposed between the second conductive type semiconductor layer 126 and the second bonding pad 134.

Each of the first electrode 162 and the second electrodes 164A and 164B may be formed of any material that may not absorb the light emitted from the active layer 124, but that may reflect or transmit the light and that may be grown to a good quality on the first and second conductive type semiconductor layers 122 and 126. For example, each of the first electrode 162 and the second electrodes 164A and 164B may be formed of a metal, and more specifically may be formed of Ag, Ni, Ti, Al, Rh, Pd, Ir, Ru, Mg, Zn, Pt, Au, Hf, Cr, or a selective combination thereof. For example, the first electrode 162 may be Cr/Ni/Au, but the embodiment is not limited thereto.

According to one embodiment, the second electrode 164A shown in FIG. 2 may correspond to a reflective layer. That is, the second electrode 164A may include only a reflective layer disposed under the second conductive type semiconductor layer 126 and electrically connected to the second conductive type semiconductor layer 126. In this case, the second segment S2 of the first insulation layer 142A may be disposed between the reflective layer that is the second electrode 164A and the inner lower edge 120-2 of the second conductive type semiconductor layer 126. Here, the inner lower edge 120-2 is not shown in FIG. 2, but is the same as the position shown in FIG. 3. In addition, the fourth-second segment S4-2 of the first insulation layer 142A may be disposed between the reflective layer which is the second electrode 164A and the outer lower edge 120-4 of the second conductive type semiconductor layer 126.

The reflective layer that is the second electrode 164A may be formed of any one selected from the group consisting of Aluminum (Al), Gold (Au), silver (Ag), Nickel (Ni), Platinum (Pt), Rhodium (Rh), Titanium (Ti), Chromium (Cr), or a metal layer containing an alloy including Al, Ag, Pt, or Rh. For example, the reflective layer may be Ag/Ni/Ti, but embodiments are not limited thereto.

According to another embodiment, the second electrode 164A shown in FIG. 2 may correspond to the light transmitting electrode layer. That is, the second electrode 164A may include only the light-transmitting electrode layer disposed under the second conductive type semiconductor layer 126. In this case, the second segment S2 of the first insulation layer 142A may be disposed between the light-transmitting electrode layer that is the second electrode 164A and the inner lower edge 120-2 of the second conductive type semiconductor layer 126, and the fourth-second segment S4-2 of the first insulation layer 142A may be disposed between the light-transmitting electrode layer which is the second electrode 164A and the outer lower edge 120-4 of the second conductive type semiconductor layer 126.

The light-transmitting electrode layer which is the second electrode 164A shown in FIG. 2 may be a transparent conductive oxide (TCO) layer. For example, the light-transmitting electrode layer may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO, but is not limited to these materials.

According to still another embodiment, as shown in FIGS. 3 and 4, the second electrode 164B may include both the light-transmitting electrode layer 164-1 and the reflective layer 164-2.

The reflective layer 164-2 may be disposed under the second conductive type semiconductor layer 126 and the light-transmitting electrode layer 164-1 may be disposed between the reflective layer 164-2 and the second conductive type semiconductor layer 126. In this case, the second segment S2 of the first insulation layer 142A may be disposed between the light-transmitting electrode layer 164-1 and the inner lower edge 120-2 of the second conductive type semiconductor layer 126. In addition, the fourth-second segment S4-2 may be disposed between the light-transmitting electrode layer 164-1 and the outer lower edge 120-4 of the second conductive type semiconductor layer 126.

In addition, in the second electrode 164B shown in FIG. 3, the fourth width W4 of the reflective layer 164-2 is smaller than the third width W3 of the light-transmitting electrode layer 164-1. In this case, at least a part of the light-transmitting electrode layer 164-1 may be vertically overlapped with the first insulation layer 142A in the second direction, while the reflecting layer 164-2 may not be vertically overlapped with the first insulation layer 142A in the second direction.

In the second electrode 164B shown in FIG. 4, the third width W3 of the light-transmitting electrode layer 164-1 and the fourth width W4 of the reflecting layer 164-2 are the same. In this case, at least a part of each of the light-transmitting electrode layer 164-1 and the reflective layer 164-2 may be overlapped with the first insulation layer 142B in the second direction.

Since the light emitting device package 100 shown in FIGS. 2 to 4 has a flip chip bonding structure, the light emitted from the active layer 124 is emitted through the substrate 110 and the first conductive type semiconductor layer 122. For this, the substrate 110 and the first conductive type semiconductor layer 122 may be formed of a light-transmitting material, and the second conductive type semiconductor layer 126 and the second electrodes 164A and 164B may be formed of a light-transmitting or non-transmitting material.

Hereinafter, a method of manufacturing the light emitting device package 100 shown in FIG. 2 will be described with reference to the attached drawings of FIGS. 5a to 5g as follows, but the embodiments are not limited thereto. That is, the light emitting device package 100 shown in FIG. 2 may be manufactured by other methods. It is apparent to those skilled in the art that the light emitting device packages A1 and A2 shown in FIGS. 3 and 4 may also be manufactured by modifying the manufacturing method shown in FIGS. 5a to 5g. In addition, for the sake of convenience of explanation, the manufacturing method for the 'A' portion in the light emitting device package 100 shown in FIG. 2 will be described with reference to FIGS. 5a to 5g, but the manufacturing process for the portions other than the 'A' is the same as shown in FIGS. 5a to 5g.

FIGS. 5a to 5g are process sectional views of the 'A' portion of the light emitting device package 100 shown in FIG. 2.

Figure 5A:
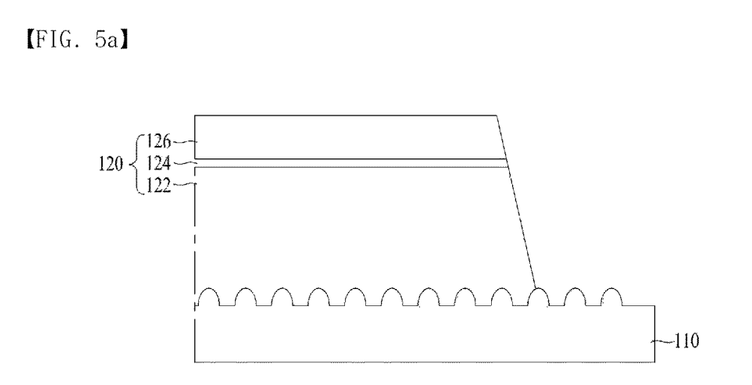
FIGS. 5a to 5g are process sectional views of the 'A' portion of the light emitting device package shown in FIG. 2.

Referring to FIG. 5a, the light emitting structure 120 is formed on the substrate 110. The substrate 110 may include a conductive material or a non-conductive material. For example, the substrate 110 may include at least one of sapphire ($Al_2O_3$), GaN, SiC, ZnO, GaP, InP, $Ga_2O_3$, GaAs, or Si.

The light emitting structure 120A may be formed by sequentially stacking a first conductive type semiconductor layer 122, an active layer 124, and a second conductive type semiconductor layer 126 on the substrate 110.

First, the first conductive type semiconductor layer 122 is formed on the substrate 110. The first conductive type semiconductor layer 122 may be formed by using a semiconductor compound such as a group III-V or II-VI semiconductor compound which is doped with a first conductive type dopant. When the first conductive type semiconductor layer 122 is an n-type semiconductor layer, the first conductive type dopant may include Si, Ge, Sn, Se, or Te as an n-type dopant without being limited thereto.

For example, the first conductive type semiconductor layer 122 may include a semiconductor material having a composition of $Al_xIn_yGa_{(1-x-y)}N$ ($0 \leq x \leq 1$, $0 \leq y \leq 1$, $0 \leq x+y \leq 1$). The first conductive type semiconductor layer 122 may include at least one of GaN, InN, AlN, InGaN, AlGaN, InAlGaN, AlInN, AlGaAs, InGaAs, AlInGaAs, GaP, AlGaP, InGaP, AlInGaP, or InP.

Next, the active layer 124 is formed on the first conductive type semiconductor layer 122. The active layer 124 may be formed to have at least one of a single-well structure, a multi-well structure, a single-quantum well structure, a multi-quantum well (MQW) structure, a quantum wire structure, or a quantum dot structure.

The active layer 124 may be formed to include a well layer and a barrier layer having a pair structure of any one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed on and/or under the active layer 124. The conductive clad layer may be formed of a semiconductor having higher band gap energy than the band gap energy of the barrier layer of the active layer 124. For example, the conductive clad layer may include GaN, AlGaN, InAlGaN, or super-lattice structure. In addition, the conductive clad layer may be doped to an n-type or a p-type.

Next, the second conductive type semiconductor layer 126 is formed on the active layer 124. The second conductive type semiconductor layer 126 may be formed of a semiconductor compound such as a group III-V or II-VI semiconductor compound. For example, the second conductive type semiconductor layer 126 may include a semiconductor material having a composition of $In_xAl_yGa_{(1-x-y)}N$ ($0 \leq x \leq 1$, $0 \leq y \leq 1$, $0 \leq x+y \leq 1$). The second conductive type semiconductor layer 126 may be doped with a second conductive type dopant. When the second conductive type semiconductor layer 126 is a p-type semiconductor layer, the second conductive type dopant may include Mg, Zn, Ca, Sr, Ba, etc. as a p-type dopant.

Figure 5B:
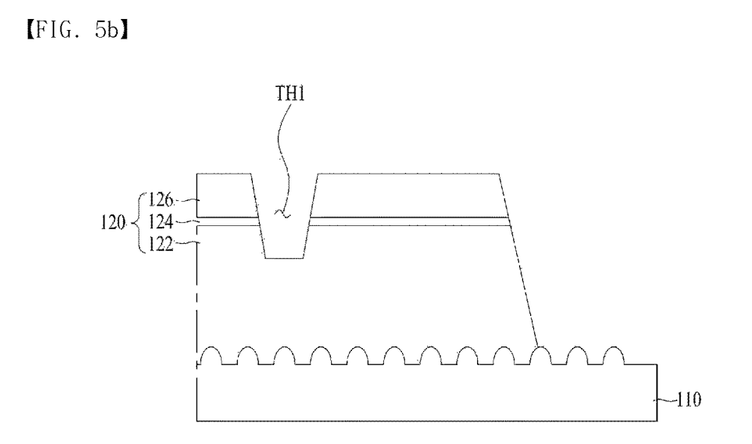

Next, referring to FIG. 5b, mesa etching is performed on the second conductive semiconductor layer 126 and the active layer 124 of the light emitting structure 120 to form a first through-hole TH1 exposing the first conductive type semiconductor layer 122. Here, as illustrated in FIG. 5b, a part of the first conductive type semiconductor layer 122 may also be mesa-etched together with the second conductive type semiconductor layer 126 and the active layer 124.

Figure 5C:
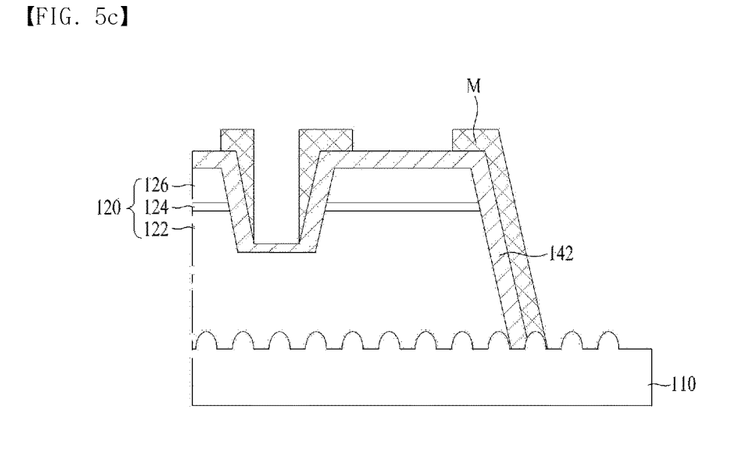

Next, referring to FIG. 5c, an $SiO_2$ layer 142 of a first insulating material, e.g., $SiO_2$, is deposited over the first conductive type semiconductor layer 122 exposed by the mesa etching, the side portion of the light emitting structure 120 exposed within the first through-hole TH1, and the second conductive type semiconductor layer 126. Thereafter, a photoresist (PR) mask M is coated on the $SiO_2$ layer 142 so as to cover the region where the first insulation layer 142A is to be formed and open another region.

Figure 5D:
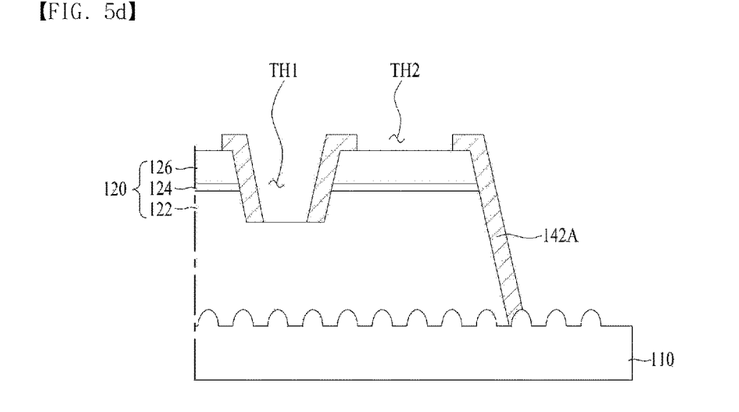

Next, referring to FIG. 5d, the $SiO_2$ layer 142 is removed, for example, by wet etching, after exposure and development by a photolithography process with using the PR mask (M). Thereafter, the PR mask M is removed to form the first insulation layer 142A and the second through-hole TH2 exposing the second conductive type semiconductor layer 126.

Alternatively, when the first insulation layer 142A is to be formed by using photosensitive polyimide instead of $SiO_2$ as the first insulating material, the photosensitive polyimide 142 is applied as a first insulating material on the first conductive type semiconductor layer 122 exposed through mesa-etching, the side portion of the light emitting structure 120 exposed in the first through-hole TH1, and the second conductive type semiconductor layer 126. Thereafter, the photosensitive polyimide 142 may be exposed and developed and then baked to form a first insulation layer 142A and a second through-hole TH2 exposing the second conductive type semiconductor layer 126.

As described above, the particle mass generated when $SiO_2$ is deposited to form the first insulation layer 142A may not be etched, which may adversely affect appearance and characteristics. In addition, the second conductive type semiconductor layer 126 may be damaged when the $SiO_2$ layer is deposited using plasma. However, when the first insulation layer 142A is formed using photosensitive polyimide instead of $SiO_2$, there is no fear that the second conductive type semiconductor layer 126 will be damaged as in the case of using the $SiO_2$ layer, and adverse effects on appearance and characteristics may be resolved, thereby minimizing or eliminating the defective proportion, and simplifying the manufacturing process to shorten the process time. In addition, when polyimide is used compared with the case of using $SiO^2$, the CBL role of the first insulation layer 142A may be more faithfully performed.

Figure 5E:
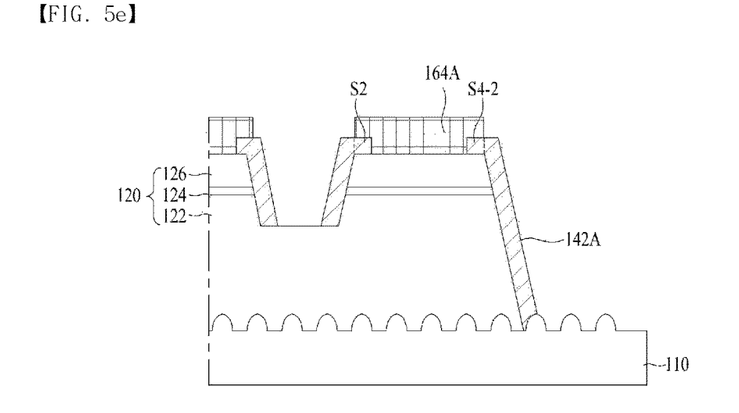
Figure 5F:
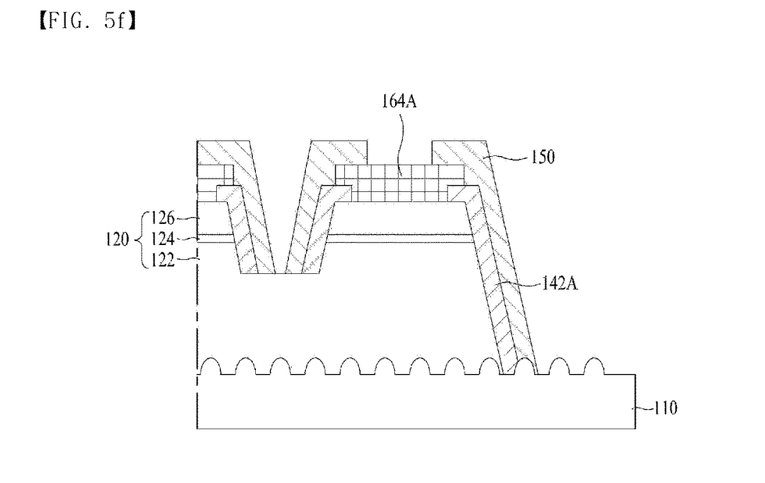
Figure 5G:
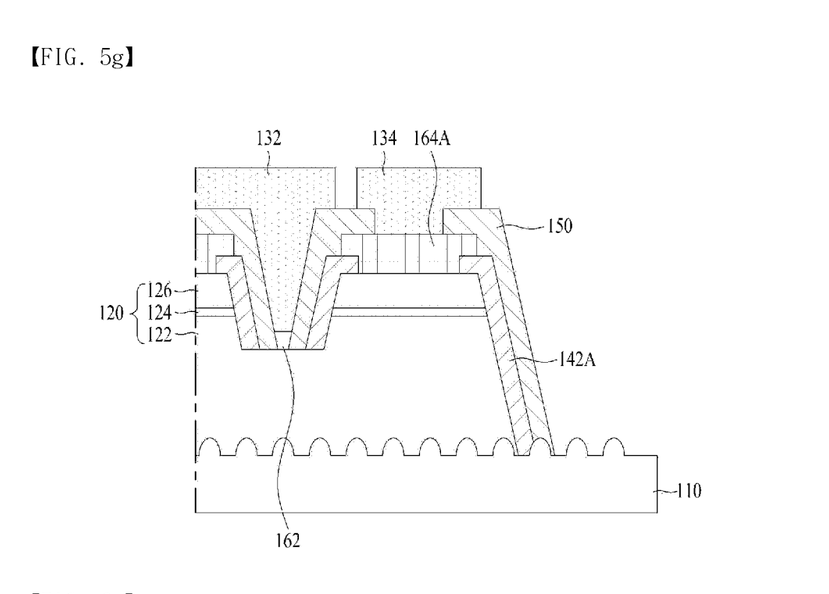

In addition, when the first insulation layer 142A is formed, especially, when the first segment S1 and the fourth-first segment 4-1 of the first insulation layer 142A are formed after the first through-hole TH1 is formed, it is possible to protect the light emitting structure 120, particularly, the active layer 124, when performing subsequent processes shown in FIGS. 5e to 5g. For example, if the second electrode 164A includes a reflective layer consisting of silver (Ag), the light emitting structure 120 may be protected from migration of silver or foreign matter (or impurities).

Next, referring to FIG. 5e, the second electrode 164A is formed on the second segment S2 and the fourth-second segment S4-2 of the first insulation layer 142A with being embedded in the second through-hole TH2. The second electrode 164A may be formed of any material that may not absorb the light emitted from the active layer 124, but that may reflect or transmit the light and that may be grown to a good quality on the second conductive type semiconductor layer 126. For example, the second electrode 164A may be formed of a metal, and may be formed of Ag, Ni, Ti, Al, Rh, Cr, Pd, Ir, Ru, Mg, Zn, Pt, Au, Hf, and a selective combination thereof.

Next, referring to FIG. 5f, the second insulation layer 150 is formed on the first insulation layer 142A with exposing the first conductive type semiconductor layer 122 in the first through-hole TH1 and the second insulation layer 150 is formed to cover the upper edge and side portion of the second electrode 164A.

The second insulation layer 150 may be formed of photosensitive polyimide (PSPI), but the embodiment is not limited thereto. Alternatively, at least one of the first insulation layer 142A or the second insulation layer 150 may be formed of at least one of $SiO_2$, $TiO_2$, $ZrO_2$, $Si_3N_4$, $Al_2O_3$, or $MgF_2$. In addition, the first insulation layer 142A and the second insulation layer 150 may be formed of a material that is the same as or different from each other.

Next, referring to FIG. 5g, the first electrode 162 is formed to be connected with the first conductive type semiconductor layer 122 exposed in the first through-hole TH1. For example, the first electrode 162 may be formed of a metal, and may be formed of Ag, Ni, Ti, Al, Rh, Pd, Ir, Ru, Mg, Zn, Pt, Au, Hf, Cr and a selective combination thereof.

Alternatively, the second insulation layer 150 may be formed after the first electrode 162 is formed, unlike FIGS. 5f and 5g.

Next, continuously referring to FIG. 5g, a first bonding pad 132 is formed on the second insulation layer 150 with being embedding in the first through-hole TH1 so as to be electrically connected to the first electrode 162. and the second bonding pad 134 is formed on the second electrode 164A exposed by the second insulation layer 150. The first and second bonding pads 132 and 134 may be formed by using a metal material having electrical conductivity and may be formed of a material that is the same as or different from the material of each of the first and second electrodes 162 and 164A.

FIG. 6a shows the light output power Po of the light emitting device package according to the embodiment, and FIG. 6b is a graph showing a comparison of the light output powers Po in the comparative example and in the embodiment. In each of FIGS. 6a and 6b, the horizontal axis represents the length L of the second or fourth segment S2 or S4 in the first direction, and the vertical axis represents the light output power Po.

As shown in above Equation (1), if the ratio between the first width W1 and the second width W2 is large, the carriers may not be uniformly distributed, resulting in a current crowding phenomenon. In order to solve this problem, the light emitting device package 100 according to the above-described embodiment includes the first insulation layers 142A and 142B disposed to serve as a current blocking layer CBL. Therefore, the injection of the carrier into the portion where the current spreading is weak may be facilitated.

Referring to FIG. 6a, it may be seen that the light output power Po is improved when the length L is larger than 0, and equal to or smaller than 40 μm, as compared with the case where the second segment S2 or the fourth-second S4-2 of the first insulation layers 142A and 142B are omitted in the light emitting device package 100 according to the above-described embodiment, that is, the case where the length L is '0.'

In addition, the light emitting device package according to the comparative example corresponds to the case where the first insulation layers 142A and 142B are omitted in the light emitting device package shown in FIGS. 2 to 4. In FIG. 6b, the light output power Po of the light emitting device package according to the comparative example is represented as "Ref." For example, referring to FIG. 6b, it is known that when the length L of the first insulation layer 142A or 142B in the first direction is 20 μm to 30 μm at an operating current of 350 mA or 500 mA, the light emitting device package according to the embodiment has the light output power superior to the light emitting device package according to the comparative example.

As a result, as described above, the light emitting device package 100 according to the embodiment uses the first insulation layers 142A and 142B, especially the second segment S2 and the fourth-second segment S4-2 so that the optical characteristics of the light emitting device package according to the embodiment may be improved. In particular, as compared with the light emitting device package according to the comparative example, the light emitting device package 100 according to the embodiment may have a high current density and may improve the current spreading.

Figure 7:
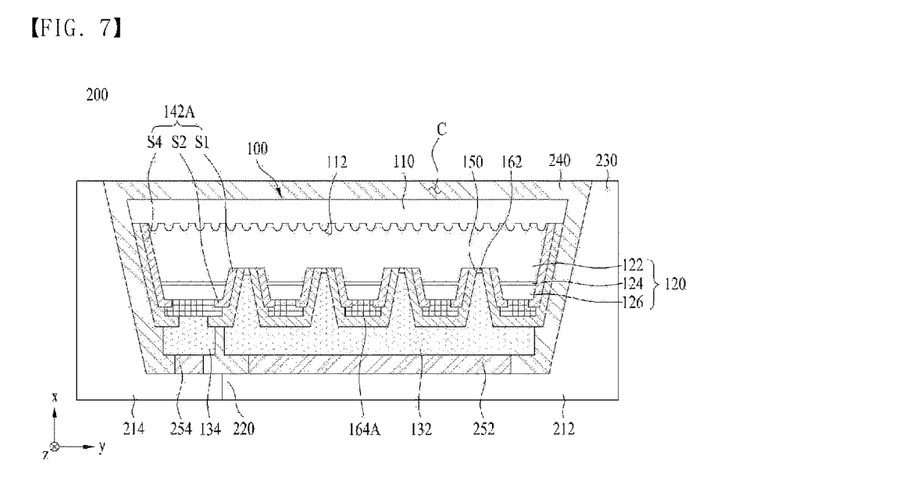
FIG. 7 shows a cross-sectional view of a light emitting device package according to still another embodiment.

FIG. 7 shows a cross-sectional view of a light emitting device package 200 according to still another embodiment.

The light emitting device package 200 shown in FIG. 7 may include the light emitting device package 100 shown in FIG. 2, first and second lead frames 212 and 214, an insulating portion 220, a package body 230, a molding member 240, first and second solder portions 252 and 254.

The first and second lead frames 212 and 214 may be electrically connected to the first and second bonding pads 132 and 134, respectively. The first and second lead frames 212 and 214 may be electrically separated from each other by the insulating portion 220. Each of the first and second lead frames 212 and 214 may be made of a conductive material, for example, metal, but the embodiment is not limited to the kind of material of each of the first and second lead frames 212 and 214.

The insulating portion 220 is disposed between the first and second lead frames 212 and 214 to electrically isolate the first and second lead frames 212 and 214 from each other. To this end, the insulation portion 220 may include at least one of $SiO_2$, $TiO_2$, $ZrO_2$, $Si_3N_4$, $Al_2O_3$, or $MgF_2$, but embodiments are not limited thereto.

The package body 230 may define the cavity C together with the first and second lead frames 212 and 214, but embodiments are not limited thereto. According to another embodiment, unlike the illustration of FIG. 7, only the package body 230 may define the cavity C. Alternatively, a barrier wall (not illustrated) may be disposed on the package body 230 having a flat upper surface so that a cavity may be defined by the barrier wall and the upper surface of the package body 230.

The light emitting device package 100 shown in FIG. 2 may be disposed in the cavity C.

The package body 230 may be formed of a silicone, a synthetic resins, or metal. The first and second lead frames 212 and 214 may be a part of the package body 230 when the package body 230 is made of a conductive material, for example, a metal material. Even in this case, the package bodies 230 forming the first and second lead frames 212 and 214 may be electrically separated from each other by the insulating portion 220.

The molding member 240 may be disposed to surround and protect the light emitting device package 100 disposed in the cavity C. The molding member 240 may be formed of, for example, silicon (Si), and may convert the wavelength of light emitted from the light emitting device package 100 because it includes a fluorescent substance. Although the fluorescent substance may include a fluorescent material of any wavelength conversion member that may convert the light generated in the light emitting device into white light such as a YAG-based, TAG-based, silicate-based, sulfide-based, or nitride-based fluorescent substance, the embodiment is not limited as to the type of the fluorescent substance.

The YAG-based and TAG-based fluorescent materials may be selected from among (Y, Tb, Lu, Sc, La, Gd, Sm)3(Al, Ga, In, Si, Fe)5(O, S)12:Ce, and the silicate-based fluorescent material may be selected from among (Sr, Ba, Ca, Mg)$_2$SiO$_4$:(Eu, F, Cl).

In addition, the sulfide-based fluorescent material may be selected from among (Ca, Sr)S:Eu and (Sr, Ca, Ba) (Al, Ga)2S4:Eu, and the nitride-based fluorescent substance may be selected from among (Sr, Ca, Si, Al, O)N:Eu (e.g. CaAlSiN4:Eu β-SiAlON:Eu) and (Ca$x$, M$y$)(Si, Al)12(O,N)16, which is based on Ca-α SiAlON:Eu (where M is at least one material of Eu, Tb, Yb, or Er, $0.05<(x+y)<0.3$, $0.02<x<0.27$ and $0.03<y<0.3$).

As a red fluorescent substance, a nitride-based fluorescent substance including N (e.g. CaAlSiN$_3$:Eu) may be used. Such a nitride-based red fluorescent substance may have higher reliability with respect to the external environment such as, for example, heat and moisture, and lower discoloration possibility than a sulfide-based fluorescent substance.

The first solder part 252 may be disposed between the first bonding pad 132 and the first lead frame 212 so as to electrically connect the two 132 and 212 to each other. The second solder part 254 may be disposed between the second bonding pad 134 and the second lead frame 214 so as to electrically connect the two 134 and 214 to each other. Each of the first solder part 252 and the second solder part 254 may be a solder paste or a solder ball, but the embodiments are not limited thereto.

The aforementioned first and second solder parts 252 and 254 may electrically connect the first and second conductive type semiconductor layers 122 and 126 to the first and second lead frames 212 and 214 through the first and second bonding pads 132 and 134, respectively, thereby eliminating the need for wires. However, according to another embodiment, the first and second conductive type semiconductor layers 122 and 126 may electrically be connected to the first and second lead frames 212 and 214, respectively, using wires.

In addition, the first solder part 252 and the second solder part 254 may be omitted. In this case, the first bonding pad 132 may serve as the first solder part 252, and the second bonding pad 134 may serve as the second solder part 254. That is, when the first solder part 252 and the second solder part 254 are omitted, the first bonding pad 132 may be directly connected to the first lead frame 212, and the second bonding pad 134 may be directly connected to the second lead frame 214.

A plurality of light emitting device packages according to the embodiment may be arranged on a board, and optical members such as a light guide plate, a prism sheet, and a diffuser sheet may be disposed on the optical path of the light emitting device package. The light emitting device packages, the board, and the optical members may function as a backlight unit.

In addition, the light emitting device package according to the embodiment may be used for an apparatus such as a display apparatus, an indicator apparatus, and a lighting apparatus.

Here, the display apparatus may include a bottom cover, a reflector disposed on the bottom cover, a light emitting module for emitting light, a light guide plate disposed in front of the reflector to guide light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light emitting module, the light guide plate, and the optical sheet may form a backlight unit.

In addition, the lighting apparatus may include a light source module that includes a board and the light emitting device package according to the embodiment, a radiator that dissipates heat of the light source module, and a power supply unit that processes or converts an electrical signal received from the outside to provide the same to the light source module. For example, the lighting apparatus may include a lamp, a headlamp, or a street light.

The headlamp may include a light emitting module that includes light emitting device packages disposed on a board, a reflector that reflects light emitted from the light emitting module in a given direction, for example, in the forward direction, a lens that refracts light reflected by the reflector forward, and a shade that blocks or reflects some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

MODE FOR INVENTION

Various embodiments have been described in the best mode for carrying out the invention.

INDUSTRIAL APPLICABILITY

The light emitting device package according to the embodiment may be used for a display apparatus, an indicator apparatus, and a lighting apparatus such as a lamp, a headlamp, or a street lamp.

The invention claimed is:

1. A light emitting device package, comprising:
a substrate;
a light emitting structure disposed under the substrate, the light emitting structure including a first conductive type semiconductor layer, an active layer, and a second conductive type semiconductor layer;
a first bonding pad embedded in a through-hole to be connected to the first conductive type semiconductor layer, the through-hole passing through the active layer and the second conductivity type semiconductor layer to expose the first conductive type semiconductor layer;
a second bonding pad spaced apart from the first bonding pad and disposed under the second conductive type semiconductor layer, the second bonding pad being connected to the second conductive type semiconductor layer;
a first insulation layer comprising:
a first segment disposed on an inner side portion of the light emitting structure in the through-hole; and
a second segment extending from the first segment in a first direction crossing a thickness direction of the light emitting structure and disposed on an inner lower edge of the light emitting structure;
a first electrode connected to the first conductive type semiconductor layer;
a second electrode connected to the second conductive type semiconductor layer extending from under the second conductive type semiconductor layer to under the second segment, the second electrode having a first recess formed in an upper edge, the first insulation layer extending into the first recess; and
a second insulation layer extending from between the first insulation layer and the first bonding pad in the through-hole to under the second electrode disposed under the second segment.

2. The package according to claim 1, wherein the second segment, the second electrode, and the second insulation layer are overlapped with each other in the thickness direction of the light emitting structure.

3. The package according to claim 2, wherein the first insulation layer further comprises at least one third segment extending from the first segment toward an inside of the second conductive type semiconductor layer in the first direction under the active layer.

4. The package according to claim 3, wherein the first insulation layer further comprises a fourth segment disposed on an outer side and on an outer lower edge of the light emitting structure, respectively.

5. The package according to claim 1, wherein the second insulation layer extends between the first electrode and the first insulation layer.

6. The package according to claim 4, wherein the second electrode is disposed between the second conductive type semiconductor layer and the second bonding pad, and between each of the second and fourth segments and the second insulation layer.

7. The package according to claim 6, wherein the second electrode comprises:
a reflective layer disposed under the second conductive type semiconductor layer; and
a light-transmitting electrode layer disposed between the reflective layer and the second conductive type semiconductor layer.

8. The package according to claim 7, wherein the second segment of the first insulation layer is disposed between the light-transmitting electrode layer and the inner lower edge of the second conductive type semiconductor layer, and the fourth segment is disposed between the light-transmitting electrode layer and the outer lower edge.

9. The package according to claim 6, wherein the second electrode comprises a reflective layer disposed under the second conductive type semiconductor layer.

10. The package according to claim 9, wherein the second segment of the first insulation layer is disposed between the reflective layer and the inner lower edge of the second conductive type semiconductor layer, and the fourth segment is disposed between the reflective layer and the outer lower edge.

11. The package according to claim 6, wherein the second electrode comprises a light-transmitting electrode layer disposed under the second conductive type semiconductor layer.

12. The package according to claim 11, wherein the second segment of the first insulation layer is disposed between the light-transmitting electrode layer and the inner lower edge of the second conductive type semiconductor layer, and the fourth segment is disposed between the light-transmitting electrode layer and the outer lower edge.

13. The package according to claim 3, wherein the inside of the second conductive type semiconductor layer in which the third segment is disposed comprises at least one of an upper portion, a lower portion, or a middle portion of the second conductive type semiconductor layer.

14. The package according to claim 4, wherein a length of the second or fourth segment in the first direction is 20 μm to 30 μm.

15. The package according to claim 1, wherein a ratio of widths of the first bonding pad and the second bonding pad in the first direction is 9:1 or 8:2.

16. The package according to claim 1, wherein at least one of the first or second insulation layer comprises a photosensitive polyimide.

17. The package according to claim 1, wherein the light emitting device package further comprises first and second lead frames connected to the first and second bonding pads, respectively.

18. The package according to claim 3, wherein the at least one third segment comprises a plurality of third segments extending from the first segment in the first direction with being spaced apart side by side from each other.

19. A lighting apparatus comprising the light emitting device package according to claim 1.

20. The package according to claim 1, further comprising a second recess formed in a lower edge of the second electrode, the second recess having a top surface and a side surface,
wherein the second insulation layer has a stepped edge to contact a lower surface of the second electrode and the top surface of the second recess.

* * * * *